(12) United States Patent
Shin

(10) Patent No.: US 12,256,628 B2
(45) Date of Patent: Mar. 18, 2025

(54) DISPLAY APPARATUS INCLUDING ELECTRIC CONDUCTIVE SUBSTRATE HAVING SPACER

(71) Applicant: LG Display Co., Ltd., Seoul (KR)

(72) Inventor: Myeongah Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/337,981

(22) Filed: Jun. 20, 2023

(65) Prior Publication Data

US 2023/0345807 A1    Oct. 26, 2023

Related U.S. Application Data

(63) Continuation of application No. 17/356,229, filed on Jun. 23, 2021, now Pat. No. 11,730,050.

(30) Foreign Application Priority Data

Dec. 29, 2020 (KR) .................. 10-2020-0185501

(51) Int. Cl.
*H10K 50/84* (2023.01)
*H10K 50/844* (2023.01)
(Continued)

(52) U.S. Cl.
CPC .......... *H10K 77/111* (2023.02); *H10K 50/844* (2023.02); *G02F 1/133305* (2013.01); *G06F 1/1641* (2013.01); *G06F 1/1652* (2013.01); *H10K 50/868* (2023.02); *H10K 59/12* (2023.02); *H10K 59/122* (2023.02); *H10K 59/35* (2023.02); *H10K 59/351* (2023.02); *H10K 59/38* (2023.02); *H10K 59/40* (2023.02); *H10K 2102/00* (2023.02); *H10K 2102/311* (2023.02)

(58) Field of Classification Search
CPC .... H10K 50/844; H10K 50/868; H10K 59/12; H10K 59/35; H10K 59/351; H10K 59/38; H10K 59/8794; H10K 59/122; H10K 59/40; H10K 77/111; H10K 2102/00; H10K 2102/311; G06F 1/1641; G06F 1/1652; G02F 1/13335; G09F 9/301; H05K 7/20954
See application file for complete search history.

(56) References Cited

U.S. PATENT DOCUMENTS 10,349,534 B2    7/2019    Kim et al.
10,582,624 B2    3/2020    Kim et al.
(Continued)

FOREIGN PATENT DOCUMENTS

BR        9206201 A       12/1994
CN    107946341 B    *    5/2020    ......... H01L 27/3227
(Continued)

*Primary Examiner* — Ida M Soward
(74) *Attorney, Agent, or Firm* — Seed IP Law Group LLP

(57) ABSTRACT

A display apparatus includes a display panel including a display area, a porous-metal substrate disposed below the display panel and including a porous metal material, and a cover substrate disposed above the display panel. The porous-metal substrate includes a flat substrate portion and first and second bent substrate portions convexly curved in opposite directions, and thicknesses of the first and second bent substrate portions are different from each other.

17 Claims, 11 Drawing Sheets

(51) Int. Cl.
*H10K 77/10* (2023.01)
*G02F 1/1333* (2006.01)
*G06F 1/16* (2006.01)
*H10K 50/80* (2023.01)
*H10K 59/12* (2023.01)
*H10K 59/122* (2023.01)
*H10K 59/35* (2023.01)
*H10K 59/38* (2023.01)
*H10K 59/40* (2023.01)
*H10K 102/00* (2023.01)

(56) References Cited

U.S. PATENT DOCUMENTS

| | | |
|---|---|---|
| 10,798,832 B2 | 10/2020 | Kim et al. |
| 10,867,532 B2 | 12/2020 | Jeon |
| 11,194,413 B2 | 12/2021 | Hong et al. |
| 2014/0140037 A1* | 5/2014 | Cho .................. F21V 9/14 |
| | | 156/212 |
| 2015/0255522 A1* | 9/2015 | Sato .................. H10K 59/12 |
| | | 438/33 |
| 2017/0237024 A1* | 8/2017 | Kanaya .............. H10K 59/131 |
| | | 257/40 |
| 2018/0033997 A1 | 2/2018 | Tang |
| 2019/0124188 A1* | 4/2019 | Yamazaki ........... H10K 50/844 |
| 2020/0144303 A1* | 5/2020 | Kajiyama ............ H05B 33/02 |
| 2020/0203443 A1* | 6/2020 | Zhao .................... H10K 71/00 |
| 2021/0028393 A1* | 1/2021 | Wang .................... H10K 71/00 |
| 2021/0118337 A1 | 4/2021 | Park |
| 2021/0265590 A1* | 8/2021 | Wang ................ H10K 50/8426 |
| 2021/0280825 A1* | 9/2021 | Beon .................... H10K 59/60 |
| 2021/0408510 A1* | 12/2021 | Xiong .................. H10K 71/00 |

FOREIGN PATENT DOCUMENTS

| | | | | |
|---|---|---|---|---|
| CN | 111211156 A | * | 5/2020 | ......... H01L 51/0096 |
| JP | 2008107440 A | * | 5/2008 | ............. G09F 9/30 |
| JP | 2019-120710 A | | 7/2019 | |
| KR | 10-2016-0049272 A | | 5/2016 | |
| KR | 10-2019-0076615 A | | 7/2019 | |
| KR | 10-2020-0095585 A | | 8/2020 | |
| WO | WO-2020133720 A1 | * | 7/2020 | ........... H01L 27/323 |

* cited by examiner

DISPLAY APPARATUS INCLUDING ELECTRIC CONDUCTIVE SUBSTRATE HAVING SPACER

CROSS-REFERENCE TO RELATED APPLICATION

This application claims priority to Korean Patent Application No. 10-2020-0185501 filed on Dec. 29, 2020 in the Korean Intellectual Property Office, the entire disclosure of which is incorporated herein by reference.

BACKGROUND

Technical Field

The present disclosure relates to a display apparatus that outputs light for displaying an image.

Description of the Related Art

Display apparatuses are widely used for image display functions of various electronic apparatuses such as mobile communication terminals, electronic notebooks, e-books, PMPs (Portable Multimedia Players), navigation systems, UMPCs (Ultra Mobile PCs), mobile phones, smart phones, tablet PCs (personal computers), watch phones, electronic pads, wearable apparatuses, portable information apparatuses, vehicle control display apparatuses, televisions, notebook computers, and monitors.

Examples of display apparatuses include a liquid crystal display apparatus (LCD), a field emission display apparatus (FED), an electro-wetting display apparatus (EWD), and an electroluminescent display apparatus (ELDD), and the like.

The display apparatus includes a display panel including a display area that emits light for displaying an image. Further, flexible display panels that may be deformed into a shape other than a flat shape are receiving attention as a next generation display device.

BRIEF SUMMARY

As a continuous bending stress acts on a bent partial area of the display panel deformed into a shape other than a flat shape, the display panel may be damaged or an image quality of the display panel may be easily deteriorated.

Therefore, a purpose of the present disclosure is to provide a display apparatus that may reduce the influence of the bending stress on the display panel.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

An aspect according to the present disclosure provides a display apparatus including a display panel including a display area, a porous-metal substrate disposed below the display panel and formed of a porous metal material, and a cover substrate disposed above the display panel.

The cover substrate includes a flat cover portion and first and second curved cover portions that are convexly curved in opposite directions. The porous-metal substrate includes a flat substrate portion corresponding to the flat cover portion and first and second bent substrate portions corresponding to the first and second curved cover portions. Further, thicknesses of the first and second bent substrate portions are different from each other.

A bending stress due to the bent shape is equal to a sum of a tensile force applied to one side of a neutral plane and a compressive force applied to the other side of the neutral plane. In this connection, the neutral plane refers to a point where the tensile force and the compressive force are equal to each other. A sealing film of the display panel has a structure in which a plurality of protective films are stacked vertically, and thus may be more easily damaged by the tensile force rather than by the compressive force.

Accordingly, according to an example according to the present disclosure, the porous-metal substrate disposed below the display panel is composed of a single layer of a porous metal material, such that a thickness of each of areas thereof is easily controlled. Therefore, adjusting a total thickness of the display apparatus under the control of the thickness of the porous-metal substrate may allow the neutral plane to be displaced. Thus, a substantial portion of the sealing film of the panel that is vulnerable to the tensile force may be out of the tensile stress range corresponding to the bending direction. As a result, the influence of the bending stress on the display panel may be reduced.

According to an embodiment according to the present disclosure, the porous-metal substrate including the porous metal material is disposed below the display panel. Since the porous metal material has thermal conductivity and shock absorption function, the porous-metal substrate may be composed of a single layer of the porous metal material.

The porous-metal substrate composed of the single layer may have various thicknesses corresponding to bent shapes of areas thereof.

As the total thickness of the display apparatus varies via the control of the thickness of the porous-metal substrate, the neutral plane may be easily displaced. As a result, a substantial portion of the sealing film of the panel that is relatively vulnerable to the tensile force may deviate from the tensile stress range. Thus, the influence of the bending stress on the display panel may be reduced.

Effects of the present disclosure are not limited to the above-mentioned effects, and other effects as not mentioned will be clearly understood by those skilled in the art from following descriptions.

DETAILED DESCRIPTIONS

Figure 1:
FIG. 1 is a diagram showing an example of an electronic product having a display apparatus according to an embodiment according to the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display apparatus according to an embodiment according to the present disclosure and an electronic product having the same will be described with reference to the accompanying drawings.

First, a display apparatus according to an embodiment according to the present disclosure and an electronic product having the same will be described.

FIG. 1 is a diagram showing an example of an electronic product having a display apparatus according to an embodiment according to the present disclosure.

An electronic product DD shown in FIG. 1 is embodied as a vehicle display apparatus placed on a front face of a dashboard inside the vehicle. Recently, as a shape of a display panel easily varies, an application range of the display panel is widened. Thus, the vehicle display apparatus DD disposed behind a steering wheel H may be mounted inside the vehicle. In one example, the vehicle display apparatus DD may display a cluster instead of a dashboard, a navigation interface that provides directions using GPS, and an entertainment interface.

As shown in FIG. 1, the vehicle display apparatus DD according to an embodiment according to the present disclosure has a display face having a shape corresponding to a front face shape of a dashboard so that aesthetic feeling of an interior of the vehicle is prevented from deteriorating.

That is, the vehicle display apparatus DD may be deformed into curved surfaces based on a shape of the front face of the dashboard so that the apparatus DD may be disposed in a conformal manner to the front face of the dashboard having curved surfaces that are curved in various directions.

In this way, the display apparatus provided in various electronic products DDs may be deformed into a shape that is different from a flat plate shape and includes various curved surfaces, depending on an installation location of the electronic product DD and the shape of the electronic product DD.

The display apparatus including the curved surface includes a curved display panel to realize a curved surface shape. A range of action of a bending stress may vary based the curved surface shapes. Thus, influence of the bending stress on the display panel may increase as various curved surface shapes are included therein.

Accordingly, an embodiment according to the present disclosure provides a display apparatus capable of reducing the influence of the bending stress due to various bending directions when the apparatus is deformed into shapes which are different from the flat plate shape and include areas bent in different directions.

Figure 2:
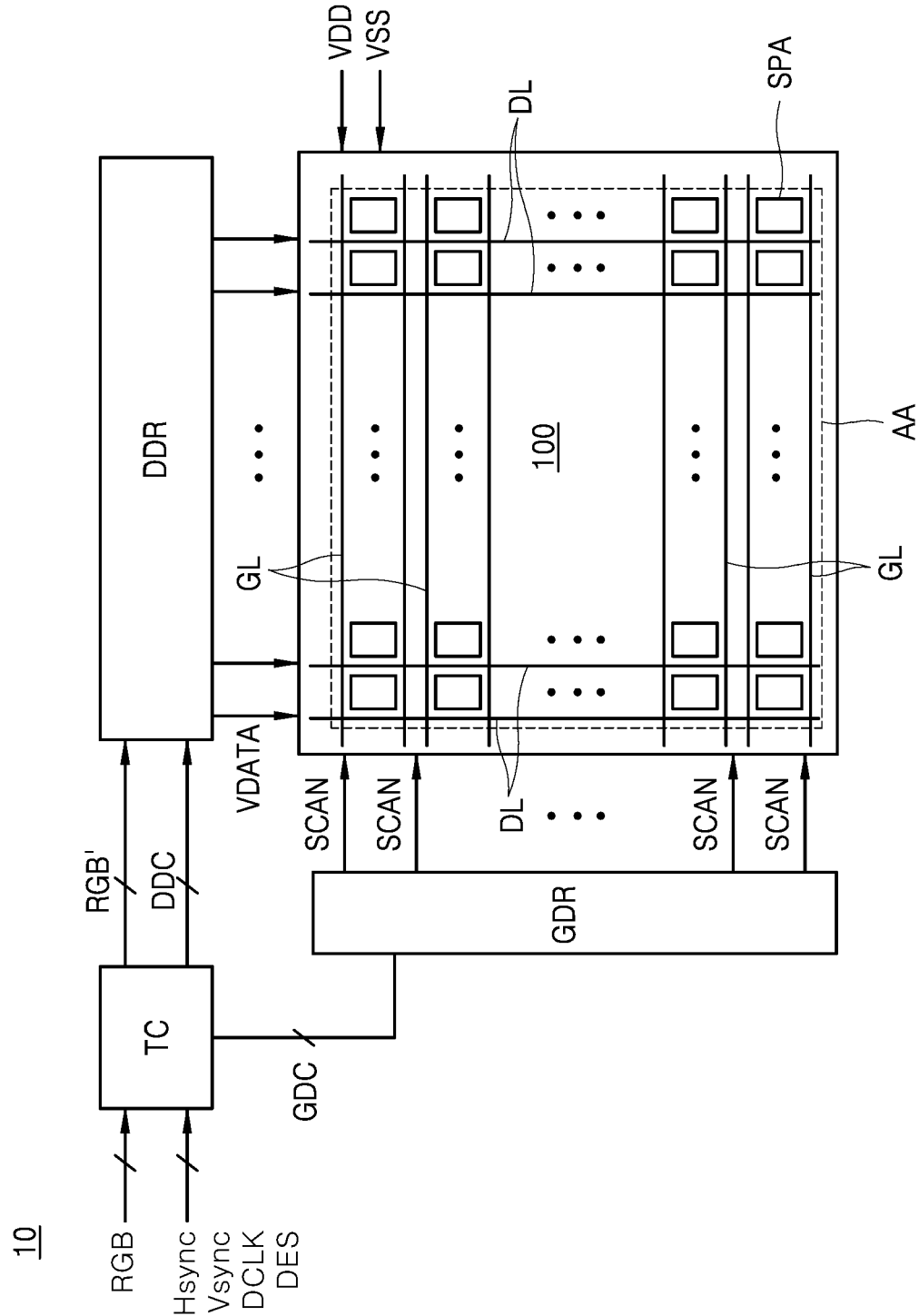
FIG. 2 is a diagram showing a display apparatus according to an embodiment according to the present disclosure.
Figure 3:
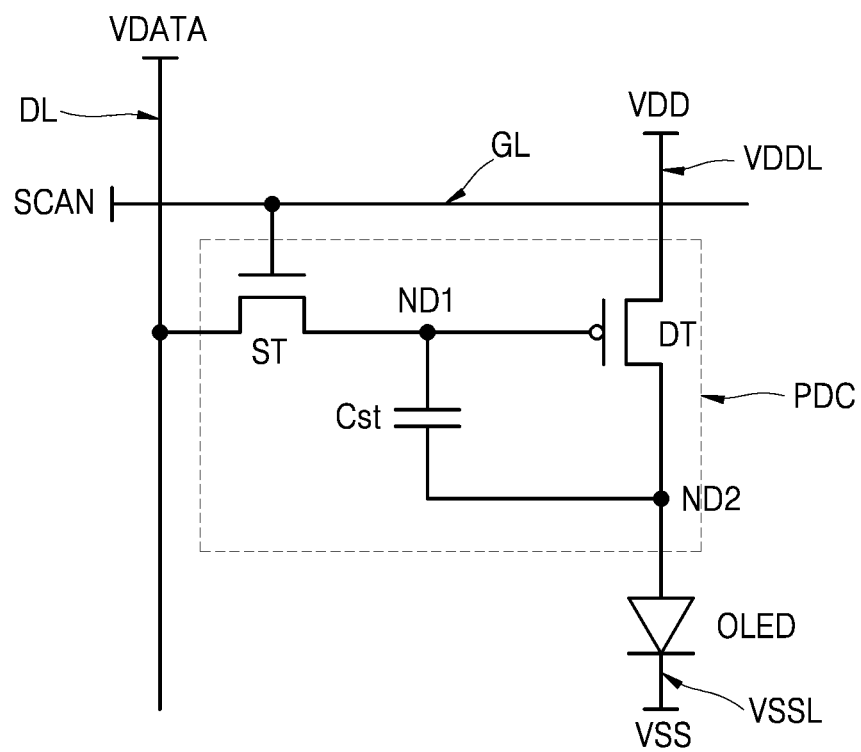
FIG. 3 is a diagram showing an example of an equivalent circuit corresponding to a sub-pixel area of FIG. 2.
Figure 4:
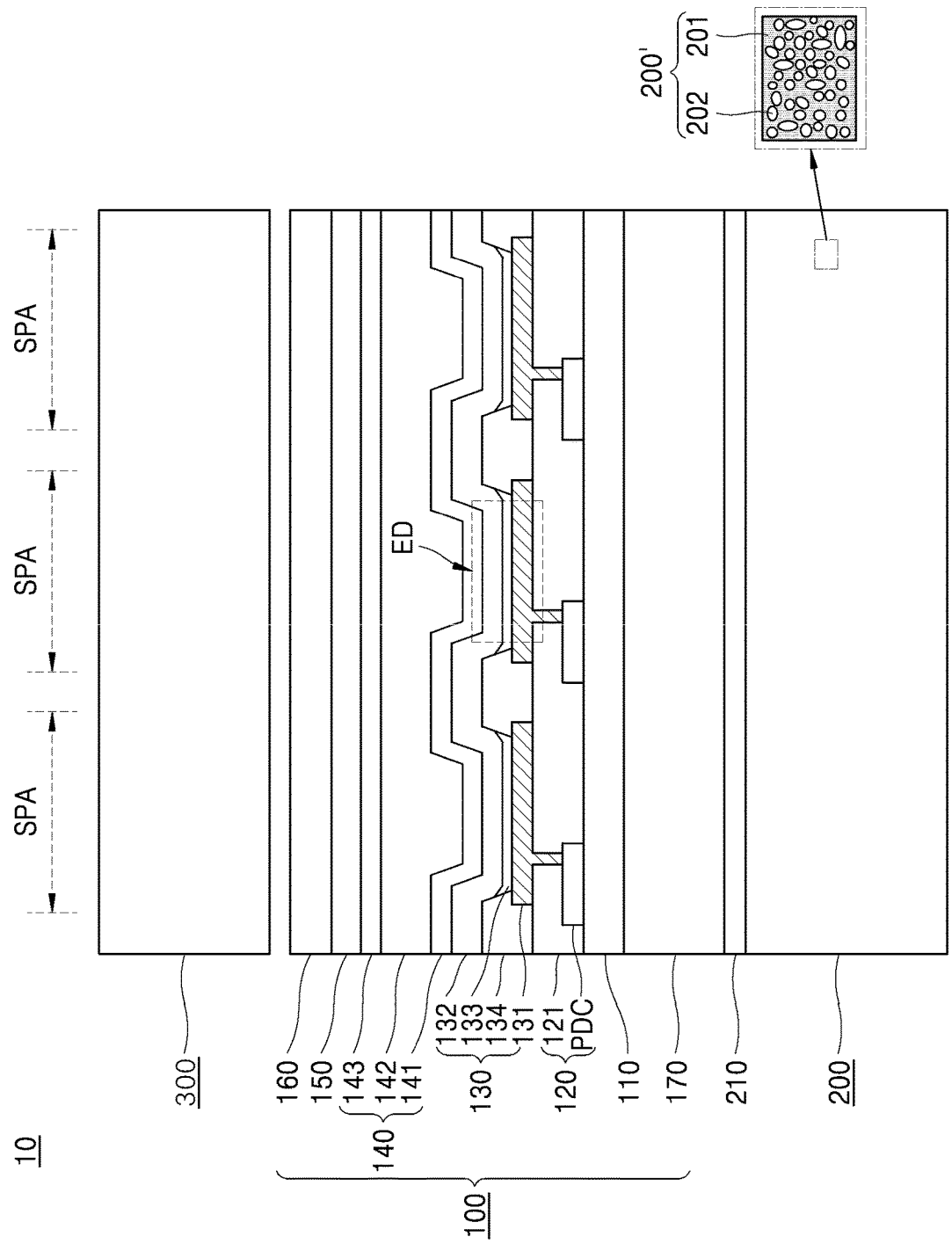
FIG. 4 is a diagram showing an example of a cross section corresponding to a portion of the display area of FIG. 2.

FIG. 2 is a diagram showing a display apparatus according to an embodiment according to the present disclosure. FIG. 3 is a diagram showing an example of an equivalent circuit corresponding to a sub-pixel area of FIG. 2. FIG. 4 is a diagram showing an example of a cross section corresponding to a portion of a display area of FIG. 2.

As shown in FIG. 2, a display apparatus 10 includes a display panel 100 including a display area AA where light is output to display an image, and a panel driver TC, GDR, and DDR that supplies driving signals to signal lines GL and DL of the display panel 100.

The display panel 100 includes a plurality of sub-pixel area SPAs arranged in the display area AA; and signal lines GL and DL connected to the plurality of sub-pixel area SPAs. The signal lines GL and DL of the display panel 100 transmit the driving signal supplied from the panel driver TC, GDR, and DDR to each sub-pixel area SPA.

When the display panel 100 displays a color image, each of the plurality of sub-pixel area SPAs emits light in a wavelength area corresponding to one color of a plurality of different colors. In this connection, the plurality of colors may include red, green, and blue. Alternatively, the plurality of colors may further include white. To this end, the display panel 100 may include a color filter (not shown).

The signal lines GL and DL of the display panel 100 may include a gate line GL that transmits a scan signal SCAN of a gate driver GDR, and a data line DL that transmits a data signal VDATA of a data driver DDR.

When the display panel 100 includes a light-emissive element (not shown) corresponding to each sub-pixel area SPA, the display panel 100 may further include first and second driving power lines for respectively supplying first and second driving powers VDD and VSS for driving the light-emissive element.

The panel driver TC, GDR, and DDR may include the gate driver GDR connected to the gate line GL of the display panel 100, the data driver DDR connected to the data line DL of the display panel 100, and a timing controller TC for controlling an operation timing of each of the gate driver GDR and the data driver DDR.

The timing controller TC rearranges digital video data RGB input from an outside to match a resolution of the display panel 100, and supplies the rearranged digital video data RGB' to the data driver DDR.

The timing controller TC supplies a data control signal DDC to control an operation timing of the data driver DDR and a gate control signal GDC to control an operation timing of the gate driver GDR, based on timing signals such as a vertical synchronization signal Vsync, a horizontal synchronization signal Hsync, a dot clock signal DCLK and a data enable signal DE.

The gate driver GDR sequentially supplies a scan signal SCAN to a plurality of gate line GLs for one frame period for displaying an image based on the gate control signal GDC. That is, the gate driver GDR supplies the scan signal SCAN to each gate line GL for each horizontal period corresponding to each gate line GL for one frame period. In this connection, the gate line GL may correspond to sub-pixel area SPAs arranged in a horizontal direction among the plurality of sub-pixel area SPAs.

The data driver DDR converts the rearranged digital video data RGB' into an analog data voltage based on the data control signal DDC. The data driver DDR supplies, to the data line DL, each data signal VDATA corresponding to each of the sub-pixel area SPAs corresponding to each gate line GL for each horizontal period, based on the rearranged digital video data RGB'.

As shown in FIG. 3, each sub-pixel area SPA includes a light-emissive element OLED and a pixel driving circuit PDC for supplying a driving signal to the light-emissive element OLED.

In one example, the pixel driving circuit PDC may include a driving transistor DT, a switching transistor ST, and a storage capacitor Cst.

In addition, although not shown in FIG. 3, each sub-pixel area SPA may further include a compensation circuit (not shown) for compensating at least one of the driving transistor DT or the light-emissive element OLED. The compensation circuit may include at least one transistor (not shown) to detect the deterioration or to supply a reference power (not shown).

The driving transistor DT is connected in series to the light-emissive element OLED and is disposed between a first driving power line VDDL supplying a first driving power VDD and a second driving power line VSSL supplying a second driving power VSS having a lower potential than that of the first driving power VDD.

That is, one end of the driving transistor DT is connected to the first driving power line VDDL, and the other end of the driving transistor DT is connected to one end of the light-emissive element OLED. Further, the other end of the light-emissive element OLED is connected to the second driving power line VSSL.

The switching transistor ST is placed between a first node ND1 and the data line DL supplying the data signal VDATA of each sub-pixel area SPA. The first node ND1 is a contact point between a gate electrode of the driving transistor DT and the switching transistor ST. Further, a gate electrode of the switching transistor ST is connected to the gate line GL.

The storage capacitor Cst is disposed between the first node ND1 and a second node ND2. The second node ND2 is a contact point between the driving transistor DT and the light-emissive element OLED.

An operation of the pixel driving circuit PDC is as follows.

The switching transistor ST is turned on based on the scan signal SCAN of the gate line GL. At this time, the data signal VDATA of the data line DL is supplied to the gate electrode of the driving transistor DT and the storage capacitor Cst via the turned-on switching transistor ST and the first node ND1.

The storage capacitor Cst is charged with the data signal VDATA.

Further, the driving transistor DT is turned on based on the data signal VDATA and a charged voltage of the storage capacitor Cst to generate a drive current corresponding to the data signal VDATA. Accordingly, the drive current resulting from the turned-on driving transistor DT may be supplied to the light-emissive element OLED.

As shown in FIG. 4, the display apparatus 10 includes the display panel 100, a porous-metal substrate 200 disposed below the display panel 100 and including porous metal material 200, and a cover substrate 300 disposed above the display panel 100 to transmit the light from the display panel 100 therethrough.

The cover substrate 300 may be formed of materials such as plastic, glass, and tempered glass. In one example, the cover substrate 11 may include a plastic material of any one of PET (polyethyleneterephthalate), PC (polycarbonate), PES (polyethersulfone), PEN (polyethylenapthanate), and PNB (polynorbornene). The cover substrate 300 may be a transparent cover substrate.

The display panel 100 and the cover substrate 300 may be coupled or connected to each other via a transparent adhesive member disposed between the display panel 100 and the cover substrate 300. In one example, the transparent adhesive member may include PSA (pressure sensitive adhesive), OCA (optical clear adhesive), and OCR (optical clear resin).

The porous-metal substrate 200 may be fixed to a bottom face of the display panel 100 via an adhesive layer 210 disposed between the display panel 100 and the porous-metal substrate 200.

In one example of the present disclosure, the adhesive layer 210 may include PSA (pressure sensitive adhesive), OCA (optical clear adhesive), and OCR (optical clear resin).

The porous-metal substrate 200 is formed of porous metal material 200' to protect the display panel 100 from thermal damage and physical shock. For example, the porous-metal substrate 200 may be a metal substrate including a porous material, heat dissipation substrate, electric conductive substrate, and shock absorbing substrate, but embodiments of the present disclosure are not limited thereto.

The porous metal material 200' may include a sponge-like metal material 201 and pores 202 distributed in the metal material 201.

The metal material 201 which constitutes the porous metal material 200' may be one of any material with relatively high thermal conductivity. In one example, the metal material 201 may be copper (Cu).

As the porous metal material 200' includes a metal material with relatively high thermal conductivity, the metal 200' may dissipate heat quickly. Accordingly, the porous-metal substrate 200 including the porous metal material 200' may dissipate the heat generated from the display panel 100. The porous-metal substrate 200 may prevent the concentration of the heat, such that damage to the display panel 100 or characteristics modification thereof due to the concentration of the heat may be prevented.

Further, since the porous metal material 200' has a porous structure, the porous metal material may retain elasticity and shock absorption at a given extent. Accordingly, the porous-metal substrate 200 including the porous metal material 200' may absorb the external physical shock to be directed to the display panel 100. Therefore, the display panel 100 may be protected from the external physical shock due to the presence of the porous-metal substrate 200.

For example, the external physical impact may include a drop type impact applying a momentary blow and a drag type impact applying a continuously moving pressure.

A related art display apparatus is equipped with an embossed shock-absorbing member to mitigate the drop-type physical impact, a porous shock-absorbing member to mitigate the drag-type physical impact, and a heat-dissipation member for heat-dissipation. That is, in the related art display apparatus, a plurality of members are stacked below the display panel.

To the contrary, according to an embodiment according to the present disclosure, the porous-metal substrate 200 disposed below the display panel 100 is formed of a single layer of the porous metal material 200'. The porous metal material 200' not only has predefined shock absorbing power and predefined elasticity according to the porous shape, but also has predefined rigidity and predefined thermal conductivity due to the metal material. Therefore, the heat-dissipation and shock-absorbing member 200 may replace a plurality of shock-absorbing members and heat-dissipation members provided in the related art electronic product 10.

As a result, the physical shock to the display panel 100 may be reduced and the heat-dissipation therefrom may occur, and further, the plurality of shock-absorbing members and heat-dissipation members may be removed, thereby slimming the display apparatus 10.

Further, since the heat-dissipation and shock-absorbing member 200 is composed of a single layer, a thickness of each of areas thereof may be easily controlled.

Considering the shock absorbing power, elasticity, thermal conductivity and rigidity of the heat-dissipation and shock-absorbing member 200, a porosity of the porous metal material 200' constituting the heat-dissipation and shock-absorbing member 200 may be in a range of 50% to 76%. In this connection, the porosity corresponds to a ratio of pores 202 to an entire volume thereof.

The display panel 100 includes a flexible support substrate 110, a transistor array 120 disposed above the support substrate 110, a light-emissive array 130 disposed above the transistor array 120, and a sealing film 140 disposed above the light-emissive array 130.

The support substrate 110 may include a flexible insulating material. In one example, the support substrate 110 may include any one of PI (polyimide), PC (polycarbonate), PET (polyethyleneterephthalate), PMP (polymethylpentene), PMMA (polymethylmethacrylate), PNB (polynorbornene), PEN (polyethylenapthanate), PES (polyethersulfone), and COS (cycloolefin copolymer).

The transistor array 120 includes the pixel driving circuit (PDC of FIG. 3) corresponding to each of the plurality of sub-pixel area SPAs. As shown in FIG. 3, the pixel driving circuit PDC may include the switching transistor ST which is turned on and off based on the driving transistor DT connected to the light-emissive element OLED and the scan signal of the gate line GL to transmit the data signal VDATA of the data line DL to the gate electrode of the driving transistor DT, and the storage capacitor Cst that is connected to the gate electrode of the driving transistor DT. The transistor array 120 further includes the signal lines GL and DL connected to the pixel driving circuit PDC of each sub-pixel area SPA.

The transistor array 120 may further include a planarization film 121 disposed above the support substrate 110 to cover the pixel driving circuit PDC in a flat manner.

The light-emissive array 130 may be disposed above the planarization film 121 of the transistor array 120.

The light-emissive array 130 includes a light-emissive element ED (OLED of FIG. 3) corresponding to each of the plurality of sub-pixel area SPAs.

Each light-emissive element ED may include a first electrode 131 and a second electrode 132 facing away each other, and a light-emissive structure 133 disposed therebetween.

In one example, the light-emissive array 130 may include the first electrode 131 disposed above the planarization film 121 and corresponding to each sub-pixel area SPA, a bank 134 disposed above the planarization film 121, and corresponding to an outer edge of each sub-pixel area SPA and covering an edge of the first electrode 131, the light-emissive structure 133 disposed on the first electrode 131, and the second electrode 132 disposed on the bank 134 and the light-emissive structure 133.

The sealing film 140 is placed on the light-emissive array 130 and seals the light-emissive array 130. For example, a sealing film 140 may be a sealing layer, an encapsulation film, and an encapsulation layer, but embodiments of the present disclosure re not limited thereto.

The sealing film 140 may have a structure in which a plurality of protective films 141, 142, and 143 including different insulating materials or having different thicknesses are sequentially stacked.

In one example, a plurality of protective films 141, 142, and 143 may include a first protective film 141 covering the second electrode 132 of the light-emissive array 130, a second protective film 142 disposed above the first protective film 141 and having a thickness greater than that of the first protective film 141, and a third protective film 143 disposed above the second protective film 142 and having a thickness smaller than that of the second protective film 142.

In this connection, each of the first and third protective films 141 and 143 may include an inorganic insulating material.

Further, the second protective film 142 may include an organic insulating material. This second protective film 142 may be disposed above the first protective film 141 in a flat manner. Due to this sealing film 140, the invasion of moisture or oxygen to the light-emissive array 130 may be delayed, such that the influence of foreign substances may be reduced.

However, as the sealing film 140 has a structure in which the plurality of insulating films 141, 142, and 143 including different materials or having different thicknesses are stacked, the invasion path of moisture or oxygen becomes complicated, thereby effectively blocking moisture or oxygen, whereas the film 140 is vulnerable to the bending stress. For example, in the second protective film 142 relatively thick and including an organic insulating material, cracks easily occur due to a tensile stress.

Accordingly, when the display apparatus 10 has a shape including a plurality of curved surfaces, a structure capable of excluding the second protective film 142 in an application range of the tensile stress in order to delay the damage or deterioration of the display apparatus 10 is required.

In addition, the display panel 100 may further include a touch electrode array 150 disposed above the sealing film 140, a polarizing plate 160 disposed above the touch electrode array 150, and a reinforcing substrate 170 disposed below the support substrate 110.

The touch electrode array 150 is configured for a touch sensing function and detects a location of a touch operation in the display area AA upon sensing an element whose property has varied via touch.

In one example, the touch electrode array 150 may include first and second touch electrodes crossing each other. In this case, the array 150 may detect the location of the change in capacitance among intersection points between the first and second touch electrodes, and detect the location where the touch operation occurred as the detected location.

The polarizing plate 160 may be provided to reduce reflection of external light in the display area AA.

The reinforcing substrate 170 is intended to increase the rigidity of the display panel 100 and may be omitted depending on the material of the support substrate 110.

The porous-metal substrate 200 may be fixed to a bottom face of the reinforcing substrate 170 via the adhesive layer 210.

Figure 5:
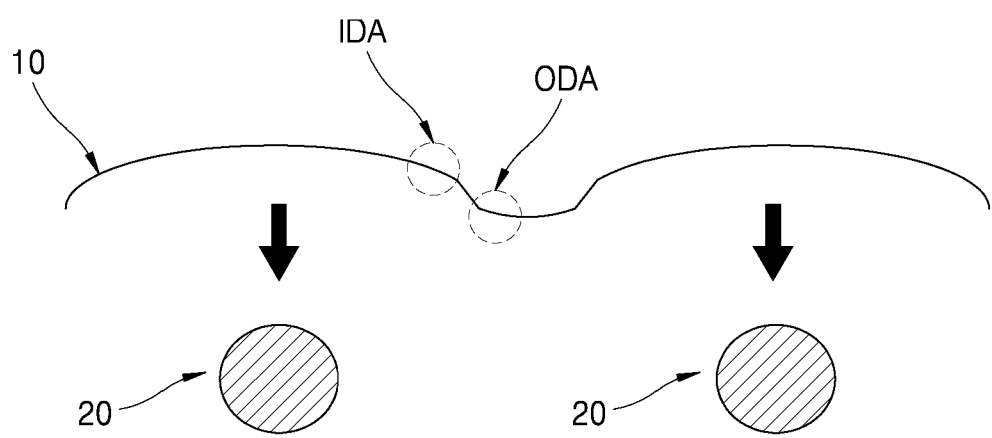
FIG. 5 is a diagram showing an example of a cross section of a display apparatus included in the electronic product of FIG. 1.

FIG. 5 is a diagram showing an example of a cross section of a display apparatus included in the electronic product of FIG. 1.

As shown in FIG. 5, the display apparatus 10 may have a shape including a plurality of curved surfaces so as to be in close contact with the front face of the dashboard inside the vehicle.

In one example, in order to provide a screen with a wide viewing angle to a user 20 at each of two front seats, a partial area of a display face of the display apparatus 10 facing toward each of the two front seats of the vehicle may be formed to have a curved surface convex in a front direction and surrounding the user 20. Further, the other partial area facing toward a space between the driver's seat and the passenger's seat has a curved surface convex toward the user 20 such that the user 20 at each of the driver's seat and the passenger's seat 20 may easily touch the curved surface.

In other words, the display apparatus 10 provided as a vehicle display apparatus is not composed of only a curved surface having a single curvature, but is composed of a combination of curved surface areas having different curvatures, a flat area, and an inclined area inclined relative to the flat area.

In this case, the display area of display apparatus 10 may include a first bent display area IDA (inner bent display area) in a shape of a curved surface convexly curved in a direction in which light is emitted (arrows in FIG. 5); and a second bent display area ODA (outer bent display area) in a shape of a curved surface convexly curved in a direction opposite to the direction in which light is emitted.

In one example, the first bent display area IDA has a shape protruding in an inward direction as the direction toward the user 20. That is, a center of curvature of the first bent display area IDA may be disposed at an outside relatively far apart from the user 20.

Further, the second bent display area ODA has a shape protruding in an outward direction as a direction toward the outside of the vehicle. That is, a center of curvature of the second bent display area ODA may be disposed at an inside relatively adjacent to the user 20.

Thus, as the display apparatus 10 includes the first and second bent display areas IDA and ODA, bending stress corresponding to each of the first and second bent display areas IDA and ODA may occur inside the display apparatus 10.

Figure 6:
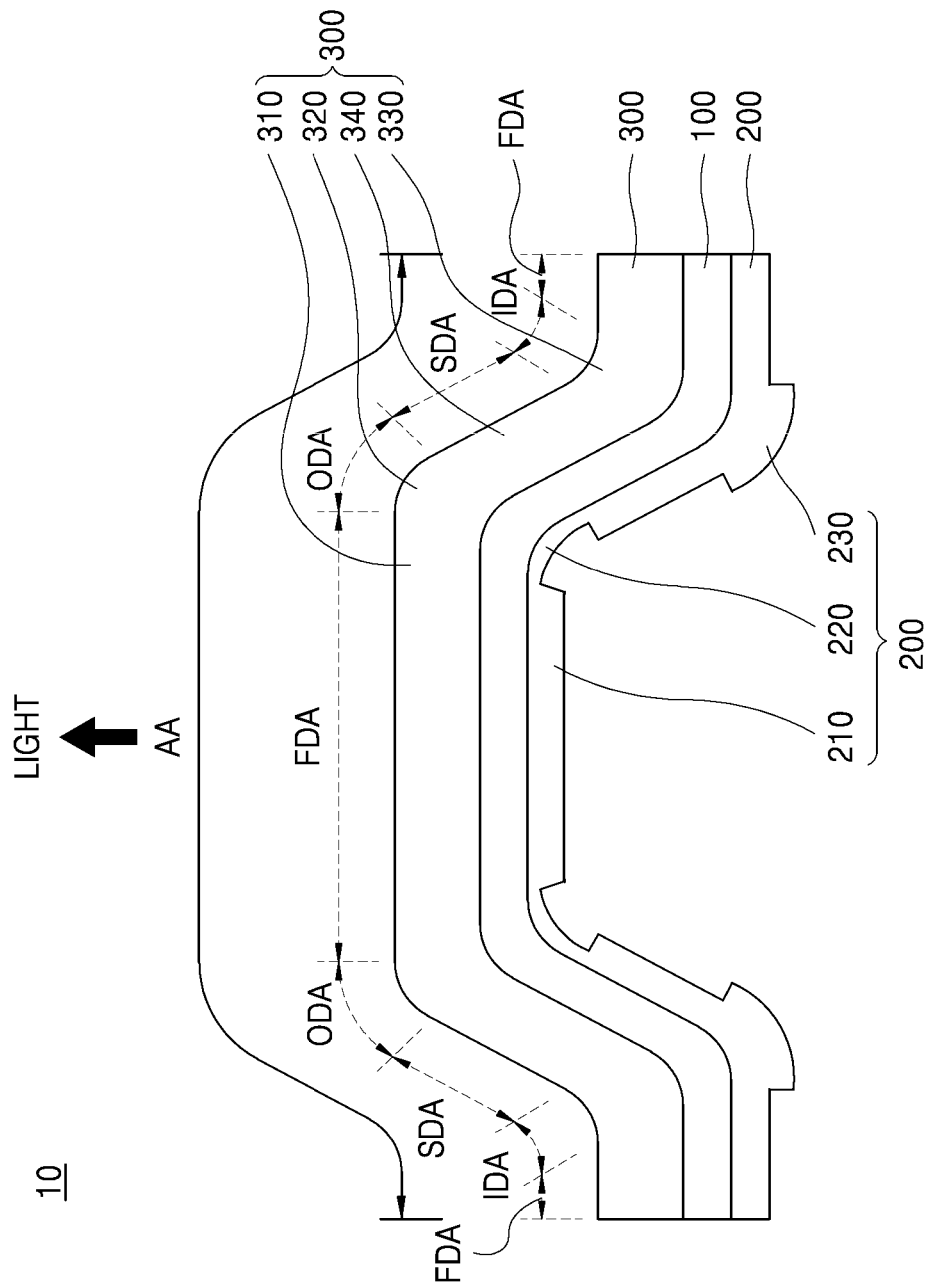
FIG. 6 is a diagram showing an example of a cross section of a portion of a display apparatus according to an embodiment of the present disclosure.

FIG. 6 is a diagram showing an example of a cross section of a portion of a display apparatus according to an embodiment according to the present disclosure.

As shown in FIG. 6, the display apparatus 10 according to an embodiment according to the present disclosure includes the display panel 100 including the display area AA that outputs light for displaying an image, the porous-metal substrate 200 which is disposed below the display panel 100 and including the porous metal material (200' in FIG. 4), and the cover substrate 300 that is disposed above the display panel 100 and transmits the light from the display panel 100 therethrough.

As mentioned above, the display apparatus 10 may be formed in a form including a plurality of curved surfaces so as to correspond to an electronic product having the same or an installation position thereof.

Therefore, the cover substrate 300 of the display apparatus 10 may be formed in a shape including a plurality of curved surfaces, and may control an entire shape of the display apparatus 10.

For example, the cover substrate 300 has a flat cover portion 310, a first curved cover portion 320 that is convexly curved in a first direction in which light from the display panel is emitted (an upward direction in FIG. 6), and a second curved cover portion 330 that is convexly curved in a second direction opposite the first direction (a downward direction in FIG. 6).

The flat cover portion 310 may be formed in a flat shape perpendicular to the first direction.

Since the first curved cover portion 320 is convexly curved in the first direction, the center of curvature of the first curved cover portion 320 may be a point spaced from the first curved cover portion 320 in the second direction.

Since the second curved cover portion 330 is convexly curved in the second direction opposite to the first direction, the center of curvature of the second curved cover portion 330 may be a point spaced from the second curved cover portion 330 in the first direction.

Further, the cover substrate 300 may further include an inclined cover portion 340 which is connected to one side of the first curved cover portion 320 or one side of the second curved cover portion 330, and that is oblique to the flat cover portion 320.

FIG. 6 illustrates that in the cover substrate 300, the flat cover portion 310 is disposed between both opposing first curved cover portions 320, and the inclined cover portion 320 is disposed between the first and second curved cover portions 320 and 330. However, the cover substrate 300 according to an embodiment according to the present disclosure is not limited to the example of FIG. 6, but may have any modification as long as the cover substrate 300 includes a plurality of curved cover portions 320 and 330 including the first and second curved cover portions 320 and 330.

The display panel 100 is provided in a form of a flexible flat plate. This display panel 100 may be in close contact on a bottom face of the cover substrate 300, and may be deformed into the same bent shape as that of the cover substrate 300.

Accordingly, the display area AA of the display panel 100 includes a flat display area FDA corresponding to the flat cover portion 310 of the cover substrate 300, a first bent display area ODA (outer bent display area) corresponding to the first curved cover portion 310 of the cover substrate 300, and a second bent display area IDA (inner bent display area) corresponding to the second curved cover portion 320 of the cover substrate 300.

Further, the display area AA of the display panel 100 may further include an inclined display area SDA (Slope Display Area) corresponding to the inclined cover portion 340 of the cover substrate 300.

In this connection, the first bent display area ODA has the outer bent shape that protrudes in the first direction in which the light of the display panel 100 is emitted. The second bent display area IDA has an inner bent shape protruding in the second direction opposite to the first direction in which the light of the display panel 100 is emitted.

Since the porous-metal substrate 200 includes a single layer of the porous metal material, the substrate 200 may be easily patterned into a shape including a plurality of thicknesses.

In other words, in the multi-layer structure, a thickness of each of the areas may be adjusted only by removing one layer from each area or adding a separate layer thereto. Further, even when the patterning is performed for adjusting a thickness of each area in at least one layer, a layer in a flat plate is disposed on one area of the patterned layer, such that a difference of the thicknesses of the areas may be reduced.

In other words, as mentioned above, the related art display apparatus includes a plurality of shock-absorbing members and heat-dissipation members disposed below the display panel 100. Thus, it is quite difficult to control a thickness of each of the areas using the plurality of shock-absorbing members and heat-dissipation members.

To the contrary, the display apparatus 10 according to an embodiment according to the present disclosure includes the porous-metal substrate 200 composed of a single layer of the porous metal material, such that the thickness of each of the areas may be adjusted using the porous-metal substrate 200.

Accordingly, the porous-metal substrate 200 according to an embodiment according to the present disclosure may include a flat substrate portion 210 corresponding to the flat cover portion 310 of the over substrate 300 and the flat display area FDA of the display area AA, a first bent substrate portion 220 corresponding to the first curved cover portion 320 of the cover substrate 300 and the first bent display area ODA of the display area AA, and a second bent substrate portion 230 corresponding to the second curved cover portion 330 of the cover substrate 300 and the second bent display area IDA of the display area AA.

In this connection, thicknesses of the first and second bent substrate portions 220 and 230 are different from each other.

Further, each of the thicknesses of the first and second bent substrate portions 220 and 230 may be different from a thickness of the flat cover portion 210.

In this way, the porous-metal substrate 200 may be composed of a single layer of the porous metal material 200', and thus may be patterned to include the first and second bent substrate portions 220 and 230 corresponding to the first and second bent display areas ODA and IDA and having the different thicknesses. Since the total thickness of the display apparatus 10 may be easily varied due to the porous-metal substrate 200, a neutral plane NL of the display apparatus 10 may be easily corrected.

Figure 7:
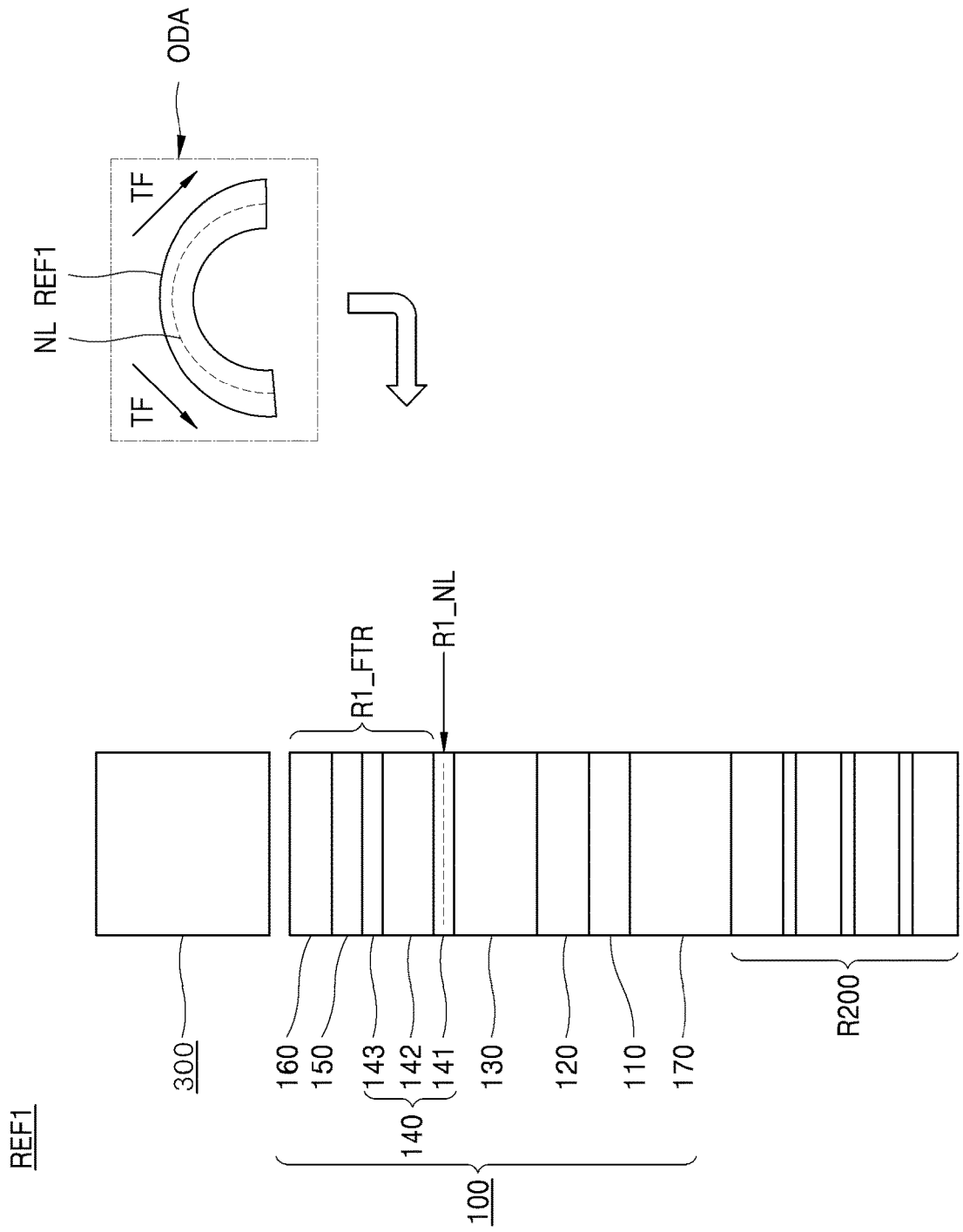
FIG. 7 is a diagram showing a tensile stress range corresponding to a first bent display area of FIG. 6 in a display apparatus of a first comparative example.
Figure 8:
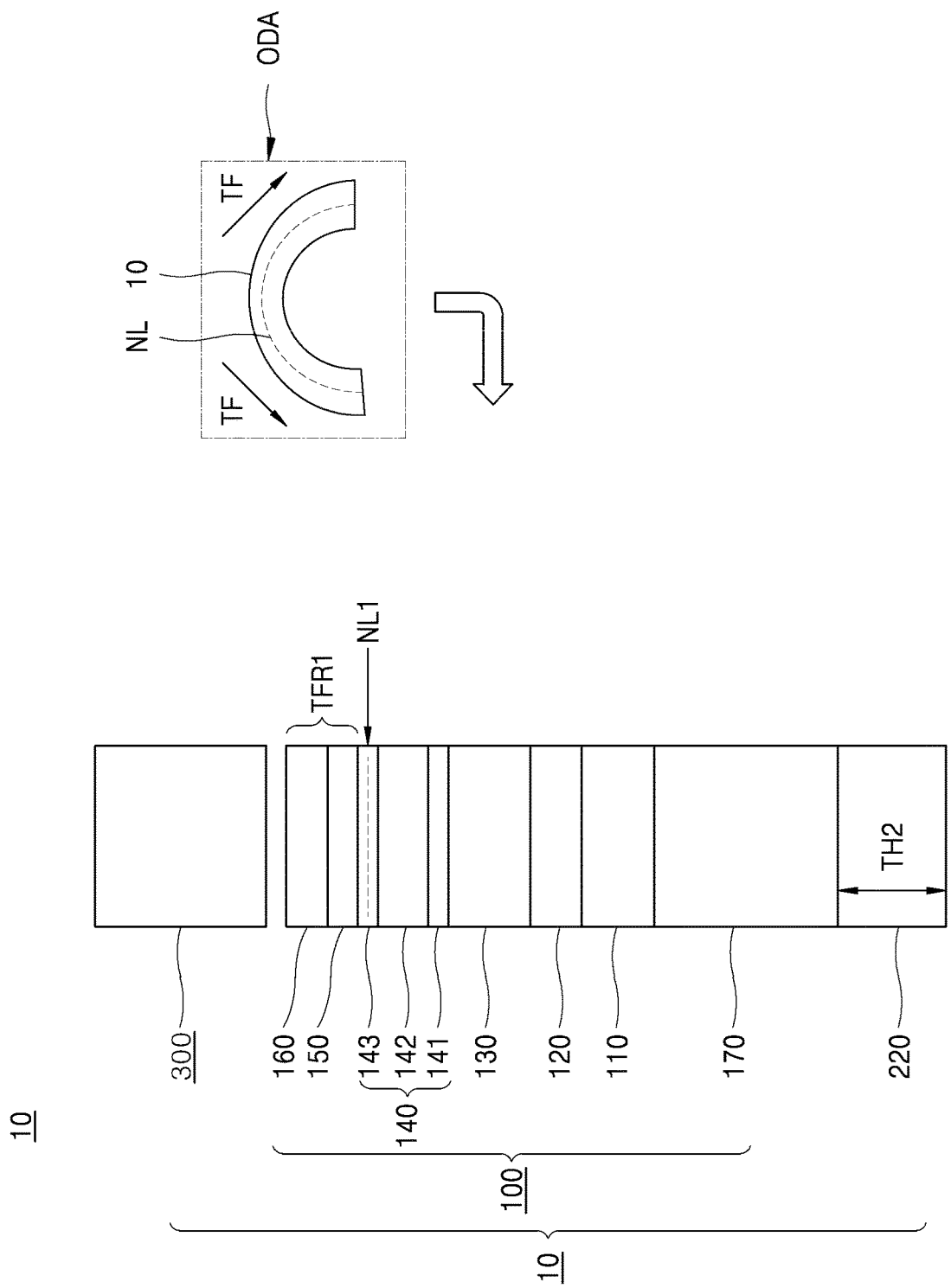
FIG. 8 is a diagram showing a tensile stress range corresponding to a first bent display area of FIG. 6 in a display apparatus according to an embodiment according to the present disclosure.

FIG. 7 is a diagram showing a tensile stress range corresponding to the first bent display area of FIG. 5 in a display apparatus of a first comparative example. FIG. 8 is a diagram showing a tensile stress range corresponding to the first bent display area of FIG. 5 in a display apparatus according to an embodiment according to the present disclosure.

As shown on a left of FIG. 7, the first bent display area ODA has a shape having convexly protruding in the first direction (an upward direction of FIG. 7) in which light is emitted. In this first bent display area ODA, a compressive force and a tensile force TF due to the bent shape works. In this connection, the neutral plane R_NL refers to a point at which the compressive force and the tensile force due to the bent shape are equal to each other.

That is, the compressive force due to the bent shape acts on components placed above the neutral plane NL in the first bent display area ODA, whereas the tensile force TF due to the bent shape acts on the components placed below the neutral plane NL in the first bent display area ODA.

In one example, the display panel 100 includes the sealing film 140 composed of a stacked structure of the plurality of insulating films 141, 142, and 143. The sealing film 140 breaks more easily due to the tensile force rather than the compressive force. Further, when a crack occurs in the sealing film 140, a lifespan of at least a portion of the light-emissive array 130 may be rapidly reduced due to invasion of oxygen or moisture.

Therefore, when a substantial portion of the sealing film 140 falls in a range TFR (Tensile Force Range; hereinafter referred to as "tensile stress range") in which the tensile force TF due to the bent shape works, cracks in the sealing film 140 may more easily occur, such that the durability and lifespan of the display apparatus 10 may be rapidly deteriorated.

In one example, as in the first comparative example REF1 shown on a right of FIG. 7, when the neutral plane R1_NL in the first bent display area ODA is located in the first protective film 141 disposed below the second protective film 142 of the sealing film 140, the tensile force is applied to a substantial portion of the sealing film 140.

In other words, in the first comparative example REF1, the second protective film 142 and the third protective film 143 of the sealing film 140 are components disposed above the neutral plane R1_NL and fall into the tensile stress range R1_TFR. Thus, the crack in the sealing film 140 may occur in a relatively easy manner. As a result, the durability and lifespan of the display panel 100 due to the bent shape may be drastically reduced.

As shown in FIG. 7, in the first comparative example REF1, the member structure R200 disposed below the display panel 100 has a stack of a plurality of shock-absorbing members and a plurality of heat-dissipation substrates, wherein an adhesive layer is interposed between the shock-absorbing member and the heat-dissipation substrate adjacent to each other. Therefore, it is actually impossible for the member structure R200 to have areas having different thicknesses.

However, the display apparatus 10 according to an embodiment according to the present disclosure includes the porous-metal substrate 200 having a single layer structure that may be patterned such that a thickness of each of the areas thereof is easily controlled. Accordingly, varying the total thickness of the display apparatus 10 under control of the thickness of the porous-metal substrate 200 may allow the neutral plane NL to be easily corrected.

That is, as shown in FIG. 8, in the display apparatus 10 according to an embodiment according to the present disclosure, the neutral plane NL1 corresponding to the first bent display area ODA may be corrected in the third protective film 143 disposed above the second protective film 142 of the sealing film 140 using the first bent substrate portion 220 of the porous-metal substrate 200 having a second thickness TH2.

As a result, only a portion of the third protective film 143 of the sealing film 140 as disposed above the neutral plane NL1 falls into the tensile stress range TFR1 of the first bent display area ODA. Thus, a substantial portion of the sealing film 140 in the first bent display area ODA is not affected by the tensile force. Therefore, the occurrence of cracks in the sealing film 140 may be delayed, and thus a rapid decrease in the durability and lifespan of the display panel 100 due to the bent shape may be prevented.

Although FIG. 8 illustrates a case where the sealing film 140 includes the first, second and third protective films 141, 142, and 143, an embodiment according to the present disclosure is not limited thereto.

That is, although not shown separately, according to an embodiment according to the present disclosure, the sealing film 140 may be composed of four or more protective films. In this case, the neutral plane NL1 corresponding to the first bent display area ODA is located in one protective film of the plurality of protective films included in the sealing film 140 which is relatively far away from the light-emissive array 130 and is relatively adjacent to the touch electrode array 150 disposed above the sealing film 140.

Figure 9:
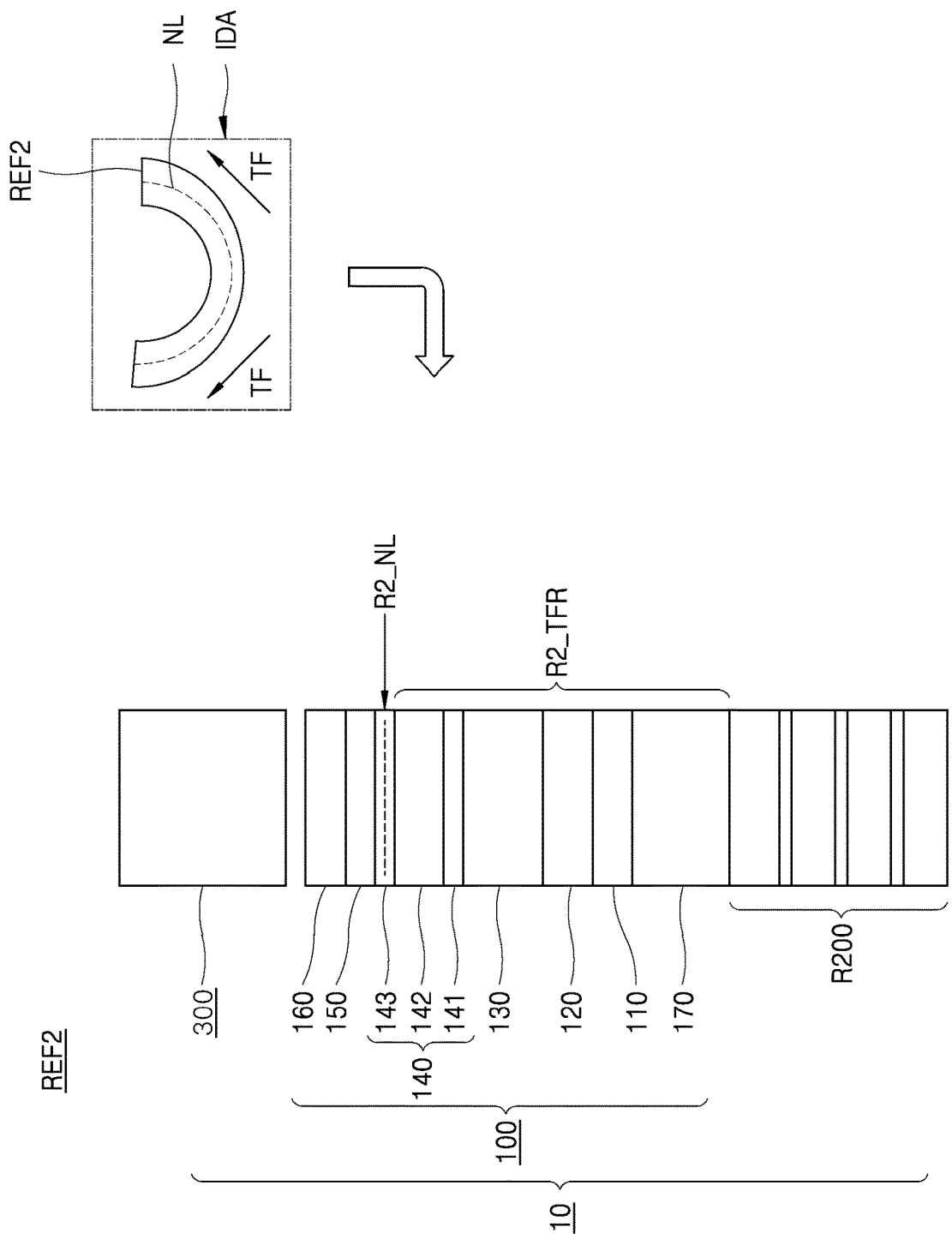
FIG. 9 is a diagram showing a tensile stress range corresponding to a second bent display area of FIG. 6 in a display apparatus of a second comparative example.
Figure 10:
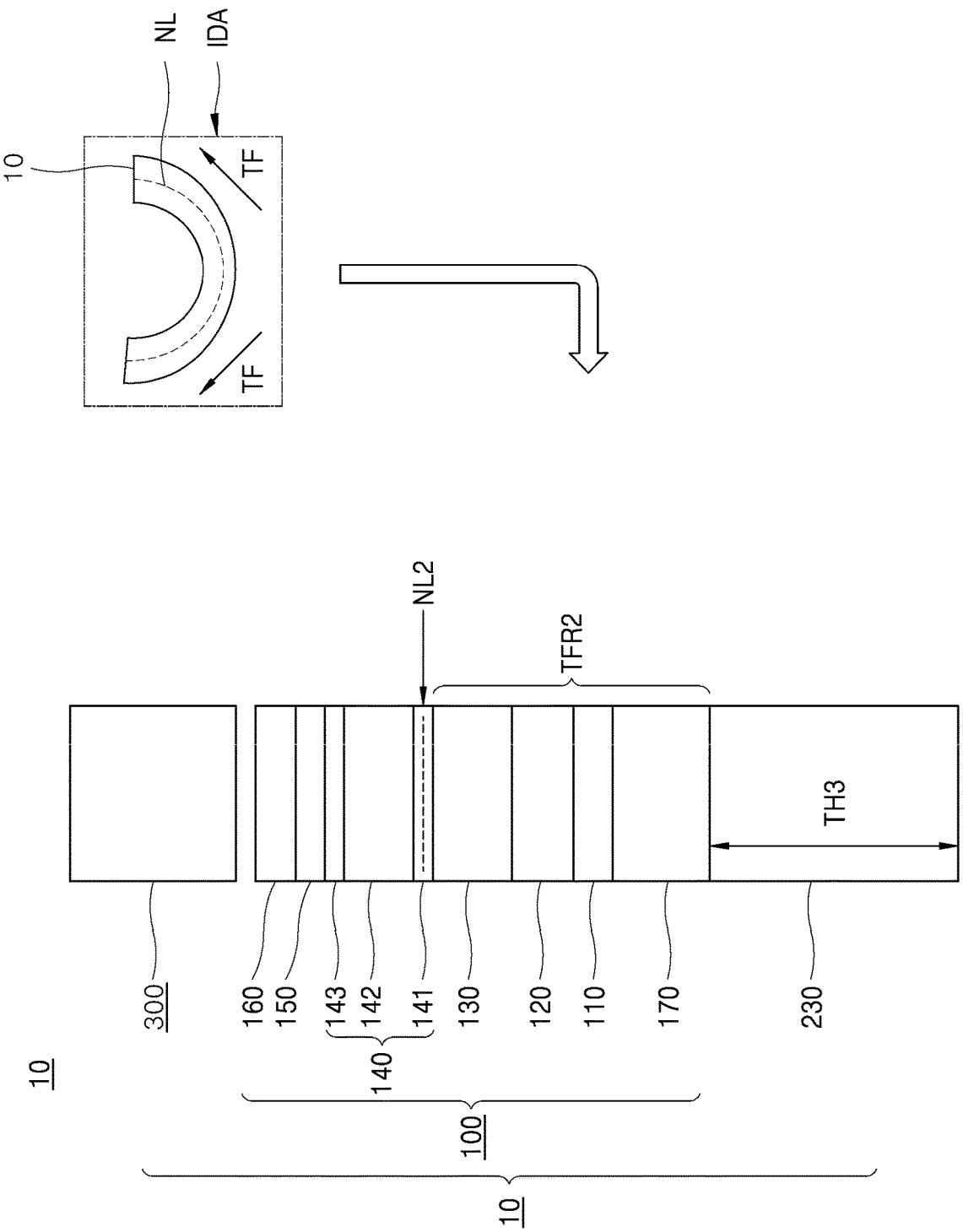
FIG. 10 is a diagram showing a tensile stress range corresponding to a second bent display area of FIG. 6 in a display apparatus according to an embodiment according to the present disclosure.

FIG. 9 is a diagram showing a tensile stress range corresponding to the second bent display area of FIG. 5 in a display apparatus of a second comparative example. FIG. 10 is a diagram showing a tensile stress range corresponding to the second bent display area of FIG. 5 in a display apparatus according to an embodiment according to the present disclosure.

As shown on a left of FIG. 9, the second bent display area IDA convexly protrudes in the second direction (downward direction in FIG. 9) opposite to the first direction in which light is emitted.

The tensile force TF due to the bent shape acts on the components as placed above the neutral plane NL in the second bent display area IDA, while the compressive force due to the bent shape acts on the components placed below the neutral plane NL in the second bent display area IDA.

However, as shown in the second comparative example REF2 shown on a right of FIG. 9, when the neutral plane R2_NL in the second bent display area IDA is located in the third protective film 143 of the sealing film 140 as disposed above the second protective film 142, the tensile force is applied to a substantial portion of the sealing film 140.

In other words, in the second Comparative Example REF2, the second protective film 142 and the first protective film 141 of the sealing film 140 are components disposed under the neutral plane R2_NL and thus fall into the tensile stress range R2_TFR. Thus, cracks in the sealing film 140 may relatively easily occur. Accordingly, the durability and lifespan of the display panel 100 due to the bent shape may be drastically reduced.

To the contrary, as shown in FIG. 10, in the display apparatus 10 according to an embodiment according to the present disclosure, the neutral plane NL2 corresponding to the second bent display area IDA may be corrected to be located in the first protective film 141 of the sealing film 140 disposed below the second protective film 142 due to the second bent substrate portion 230 of the porous-metal substrate 200 having a third thickness TH3.

As a result, only a portion of the first protective film 141 of the sealing film 140 as placed below the neutral plane NL2 falls into the tensile stress range TFR2 of the second bent display area IDA. Thus, a substantial portion of the sealing film 140 in the second bent display area IDA may not be affected by the tensile force. Therefore, the occurrence of cracks in the sealing film 140 may be delayed, and thus a rapid decrease in the durability and lifespan of the display panel 100 due to bent shape may be prevented.

Although FIG. 10 illustrates a case in which the sealing film 140 includes the first, second and third protective films 141, 142, and 143, an embodiment according to the present disclosure is not limited thereto. That is, although not shown separately, according to an embodiment according to the present disclosure, the sealing film 140 may be composed of four or more protective films. In this case, the neutral plane NL2 corresponding to the second bent display area IDA is located in one of the plurality of protective films included in the sealing film 140 which is relatively adjacent to the light-emissive array 130.

Next, examples of the porous-metal substrate according to an embodiment according to the present disclosure will be described with reference to FIGS. 11 and 12.

Figure 11:
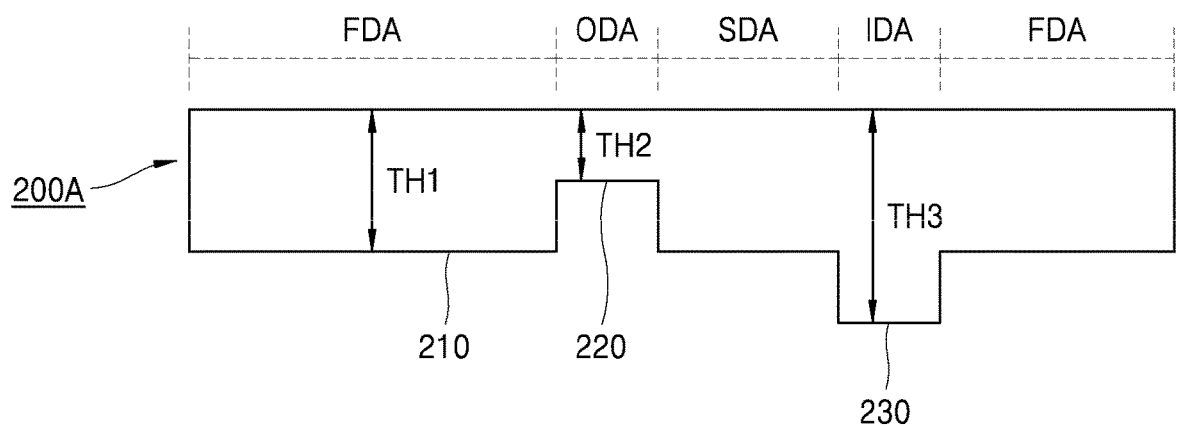
FIG. 11 is a view showing a state in which a porous-metal substrate according to an embodiment according to the present disclosure is unfolded.

FIG. 11 is a view showing a state in which a porous-metal substrate according to an embodiment according to the present disclosure is unfolded.

As shown in FIG. 11, a porous-metal substrate 200A according to an embodiment according to the present disclosure includes a flat substrate portion 210 corresponding to the flat cover portion (310 in FIG. 6) of the cover substrate (300 in FIG. 6) and the flat display area FDA of the display area (AA in FIG. 6), a first bent substrate portion 220 corresponding to the first curved cover portion 320 of the cover substrate 300 and the first bent display area ODA of the display area AA, and a second bent substrate portion 230 corresponding to the second curved cover portion 330 of the cover substrate 300 and the second bent display area IDA of the display area AA.

Further, when the cover substrate 300 has a structure including the inclined cover portion 340, the display area AA includes the inclined display area SDA corresponding to the inclined cover portion 340. In this connection, each of the inclined cover portion 340 and the inclined display area SDA is not in a bent state, and thus does not generate the bending stress. Accordingly, a portion of the porous-metal substrate 200A corresponding to the inclined display area SDA has a first thickness TH1 as in the flat substrate portion 210.

A thickness TH2 of the first bent substrate portion 320 corresponding to the first bent display area ODA is different from a thickness TH3 of the second bent substrate portion 330 corresponding to the second bent display area IDA having a curved surface shape different from that of the first bent display area ODA.

That is, when the flat substrate portion 210 has the first thickness TH1, the first bent substrate portion 220 corresponding to the first bent display area ODA may have the second thickness TH2 which is smaller than the first thickness TH1 of the flat substrate portion 210. As such, since a total thickness of the display apparatus 10 in the first bent display area ODA is smaller than that in the flat display area FDA, the neutral plane (NL1 in FIG. 8) may be displaced upwards.

Since the first bent display area ODA has an outer bent shape, the tensile stress range (TFR1 in FIG. 1) corresponding to the first bent display area ODA contains a component disposed above the neutral plane NL1.

Accordingly, the neutral plane NL1 in the first bent display area ODA is displaced upwards. Thus, the tensile stress range TFR1 corresponding to the first bent display area ODA may be reduced. Therefore, the influence of the bending stress on the display panel 100 may be reduced.

Further, the second bent substrate portion 230 corresponding to the second bent display area IDA may have the third thickness TH3 larger than the first thickness TH1 of the flat substrate portion 210. As such, the total thickness of the display apparatus 10 in the second bent display area IDA is larger than that in the flat display area FDA, the neutral plane (NL2 in FIG. 10) may be displaced downwards.

Since the second bent display area IDA has an inner bent shape, the tensile stress range (TFR2 in FIG. 10) corresponding to the second bent display area IDA contains a component placed under the neutral plane NL2.

Accordingly, the neutral plane NL2 in the second bent display area IDA is displaced downward. The tensile stress range TFR2 corresponding to the second bent display area IDA may be reduced. Therefore, the influence of the bending stress on the display panel 100 may be reduced.

A shock-absorbance of the porous metal material 200' that constitutes the porous-metal substrate 200A depends on an absolute volume of the pores. Thus, the shock-absorbance of the porous-metal substrate 200A may depend on the thickness of the porous-metal substrate 200A. Accordingly, in consideration of a magnitude of the physical impact applied to the display panel 100, a minimum value of the first thickness TH1 of the flat substrate portion 210 may be derived.

Further, as the first thickness TH1 of the flat substrate portion 210 increases, the total thickness of the display apparatus 10 increases. Thus, a maximum value of the first thickness TH1 of the flat substrate portion 210 may be derived in consideration of slimming of the display apparatus 10.

In one example, the first thickness TH1 may range from 70 μm to 200 μm.

The second thickness TH2 of the first bent substrate portion 220 corresponding to the first bent display area ODA is selected to be smaller than the first thickness TH1 to reduce the tensile stress range TFR1 in the outer bent shape. Further, the minimum value of the second thickness TH2 may be determined such that the physical shock mitigation function and the heat-dissipation function are not removed.

In one example, the second thickness TH2 may range from 50 μm to the first thickness TH1.

The third thickness TH3 of the second bent substrate portion 230 corresponding to the second bent display area IDA is selected to be larger than the first thickness TH1 to reduce the tensile stress range TFR2 in the inner bent shape. Further, the maximum value of the third thickness TH3 may be determined so as not to significantly hinder the slimming of the display apparatus 10.

In one example, the third thickness TH3 1may range from the first thickness TH1 to 220 μm.

In one example, since the porous-metal substrate 200 also has the bending stress due to the bent shape, a scheme to reduce the bending stress on the porous-metal substrate 200 is required. Accordingly, a porous-metal substrate according to another embodiment according to the present disclosure is provided.

Figure 12:
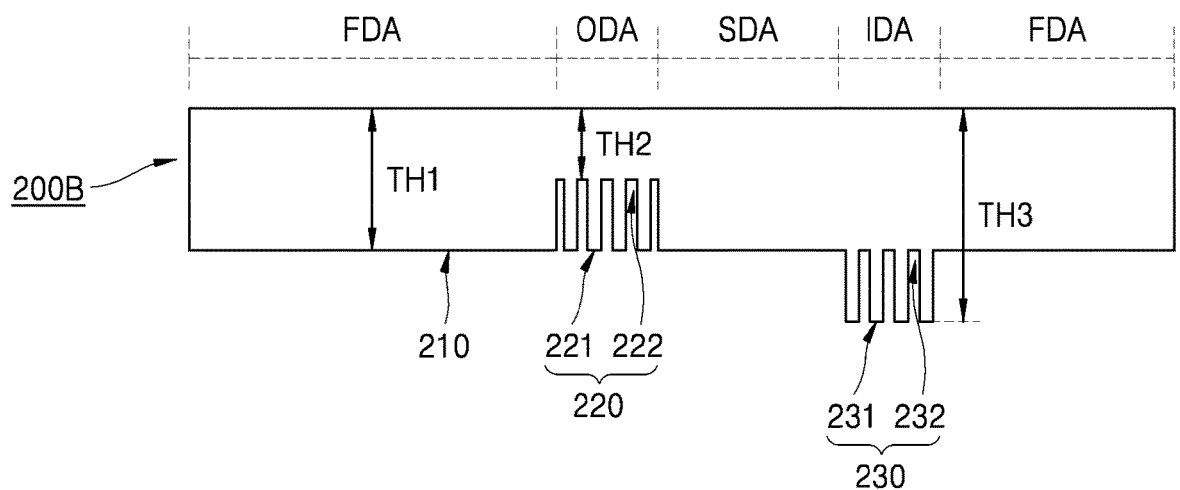
FIG. 12 is a view showing a state in which a porous-metal substrate according to another embodiment according to the present disclosure is unfolded.

FIG. 12 is a view showing an unfolded state of a porous-metal substrate according to another embodiment according to the present disclosure.

As shown in FIG. 12, a porous-metal substrate 200B according to another embodiment according to the present disclosure includes a plurality of protrusions 221 is the same as the porous-metal substrate 200A shown in FIG. 11 except that first and second bent substrate portions 220' and 230' have a plurality of protrusions 231 and a plurality of spacers 222 and 232 which alternately arranged with each other. Thus, redundant descriptions are omitted below.

The porous-metal substrate 200B according to another embodiment according to the present disclosure has a flat substrate portion 210 corresponding to the flat display area FDA and having the first thickness TH1, and a first bent substrate portion 220' corresponding to the first bent display area ODA, and a second bent substrate portion 230' corresponding to the second bent display area IDA.

In the porous-metal substrate 200B according to this embodiment of the present disclosure, the first bent substrate portion 220' includes a plurality of first protrusions 221 having the first thickness TH1 and a plurality of first spacers 222 having the second thickness TH2 smaller than the first thickness TH1, wherein each first spacer is disposed between adjacent ones of the plurality of first protrusions 221.

As described above, the first bent substrate portion 220' corresponding to the first bent display area ODA includes the plurality of first spacers 222 having the relatively smaller second thickness TH2. Accordingly, due to the plurality of first spacers 222, the total thickness of the display apparatus 10 in a portion of the first bent display area ODA is smaller than that in the flat display area FDA, such that the neutral plane NL1 may be displaced upwards.

Further, as the first bent substrate portion 220' includes the plurality of first protrusions 221 having the first thickness TH1, the heat-dissipation function and the physical shock mitigation function in the first bent display area ODA may be prevented from being significantly deteriorated.

Further, since the first bent substrate portion 220' has a structure in which the plurality of first protrusions 221 and the plurality of first spacers 222 are alternately arranged with each other, the compressive force occurring in the porous-metal substrate 200B due to the bent shape may be reduced. As a result, the bending stress of the porous-metal substrate 200B may be reduced.

Likewise, the second bent substrate portion 230' of the porous-metal substrate 200B according to another embodiment according to the present disclosure includes a plurality of second protrusions 231 having the third thickness TH3 greater than the first thickness TH1, and a plurality of second spacers 232 having the first thickness TH1, wherein each second spacer is disposed between adjacent ones of the plurality of second protrusions 231.

As such, the second bent substrate portion 230' corresponding to the second bent display area IDA includes the plurality of second protrusions 231 having a relatively larger third thickness TH3. Due to the plurality of second protrusions 231, the total thickness of the display apparatus 10 in a portion of the second bent display area IDA is larger than that in the flat display area FDA, so that the neutral plane NL2 may be displaced downwards.

Further, since the second bent substrate portion 230' has a structure in which the plurality of second spacers 232 having the first thickness TH1 and the plurality of second protrusions 231 are alternately arranged with each other, the tensile force occurring in the porous-metal substrate 200B due to the bent shape may be reduced. As a result, the bending stress of the porous-metal substrate 200B may be reduced.

In addition, one of the protrusions 221 and 231 and the spacers 222, 232 provided in each of the first and second bent substrate portions 220' and 230' has the first thickness TH1 which is equal to that of the flat substrate portion 210. Thus, the porous-metal substrate 200B may be prepared relatively easily using a stacking process corresponding to one of the first, second and third thicknesses TH1, TH2, and TH3, and two patterning processes corresponding to the remaining two of the first, second and third thicknesses TH1, TH2, and TH3.

As described above, the display apparatus 10 according to each of one embodiment and another embodiment according to the present disclosure includes each of the porous-metal substrates 200, 200A, and 200B, each having a single layer of the porous metal material. The display apparatus 10 is formed in a shape including a plurality of curved surfaces, and the porous-metal substrate 200 includes the substrate portions 210, 220, and 230, and 210, 220', and 230' having thicknesses corresponding to the bent shapes of the curved surfaces. Accordingly, since the total thickness of the display apparatus 10 may vary under control of each of the thicknesses of the substrate portions included in the porous-metal substrate 200, the neutral plane NL may be easily displaced.

Accordingly, the neutral plane NL may be displaced in a direction such that a substantial portion of the sealing film 140 may deviate from the tensile stress range TFR, and thus the influence of the bending stress on the display panel 100 may be reduced.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A display apparatus, comprising:
a display panel including a display area configured to output light in a first direction and display an image; and
an electric conductive substrate disposed below the display panel and including at least one spacer,
wherein the display panel comprises:
a flexible support substrate;
a transistor array disposed on the flexible support substrate;
a light-emissive array disposed on the transistor array;
a sealing film disposed on the light-emissive array;
a touch electrode array disposed on the sealing film;
a polarizing plate disposed on the touch electrode array; and
a reinforcing substrate disposed on the flexibility support substrate.

2. The display apparatus of claim 1, wherein the electric conductive substrate includes a porous material.

3. The display apparatus of claim 1, wherein the electric conductive substrate includes a metal material including copper.

4. The display apparatus of claim 1, wherein the electric conductive substrate includes a front surface in the first direction of the display panel, and a rear surface in a second direction opposite to the first direction,
wherein the at least one spacer is disposed on the rear surface of the electric conductive substrate.

5. The display apparatus of claim 4, wherein the at least one spacer is defined, at least in part, by the rear surface of the electric conductive substrate being recessed toward the front surface.

6. The display apparatus of claim 1, wherein a first thickness of a first portion of the electric conductive substrate including the at least one spacer is less than a second thickness of a second portion of the electric conductive substrate on a side of the at least one spacer.

7. The display apparatus of claim 1, wherein the electric conductive substrate includes at least one protrusion disposed on a side of the at least one spacer of the electric conductive substrate.

8. The display apparatus of claim 4, wherein the electric conductive substrate includes at least one protrusion that is spaced apart from the at least one spacer and extends outward from the rear surface of the electric conductive substrate in the second direction.

9. The display apparatus of claim 1, wherein the electric conductive substrate includes a plurality of pores internal to the electric conductive substrate.

10. A display apparatus of comprising:
   a display panel including a display area configured to output light in a first direction and display an image;
   an electric conductive substrate disposed below the display panel and including at least one spacer; and
   a cover substrate disposed on the display panel and structured to transmit the light output from the display panel,
   wherein the cover substrate includes:
      a flat portion including a flat surface;
      a first curved portion corresponding to the at least one spacer of the electric conductive substrate, the first curved portion being convexly curved toward the first direction; and
      a second curved portion convexly curved toward the second direction,
      wherein the flat portion is interposed between the first curved portion and the second curved portion.

11. The display apparatus of claim 10, wherein the electric conductive substrate includes a porous material.

12. The display apparatus of claim 10, wherein the electric conductive substrate includes a metal material including copper.

13. The display apparatus of claim 10, wherein the electric conductive substrate includes a front surface in the first direction of the display panel, and a rear surface in a second direction opposite to the first direction,
   wherein the at least one spacer is disposed on the rear surface of the electric conductive substrate.

14. The display apparatus of claim 13, wherein the at least one spacer is defined, at least in part, by the rear surface of the electric conductive substrate being recessed toward the front surface.

15. The display apparatus of claim 10, wherein a first thickness of a first portion of the electric conductive substrate including the at least one spacer is less than a second thickness of a second portion of the electric conductive substrate on a side of the at least one spacer.

16. The display apparatus of claim 10, wherein the electric conductive substrate includes at least one protrusion disposed on a side of the at least one spacer of the electric conductive substrate.

17. The display apparatus of claim 13, wherein the electric conductive substrate includes at least one protrusion that is spaced apart from the at least one spacer and extends outward from the rear surface of the electric conductive substrate in the second direction.

* * * * *